(12) United States Patent
Konan et al.

(10) Patent No.: US 11,532,372 B2
(45) Date of Patent: Dec. 20, 2022

(54) REMOTE SSD DEBUG VIA HOST/SERIAL INTERFACE AND METHOD OF EXECUTING THE SAME

(71) Applicant: SK hynix Inc., Gyeonggi-do (KR)

(72) Inventors: Andrei Konan, Minsk (BY); Sergei Peniaz, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 724 days.

(21) Appl. No.: 16/503,914

(22) Filed: Jul. 5, 2019

(65) Prior Publication Data

US 2020/0013476 A1 Jan. 9, 2020

Related U.S. Application Data

(60) Provisional application No. 62/694,688, filed on Jul. 6, 2018.

(51) Int. Cl.
*G11C 29/38* (2006.01)
*G06F 13/42* (2006.01)

(52) U.S. Cl.
CPC .......... *G11C 29/38* (2013.01); *G06F 13/4282* (2013.01)

(58) Field of Classification Search
CPC . G11C 29/38; G11C 29/48; G11C 2029/0401; G11C 29/56; G06F 13/4282
USPC .......................................................... 714/33
See application file for complete search history.

(56) References Cited

U.S. PATENT DOCUMENTS

| 10,176,078 | B1 * | 1/2019 | Motel | G06F 11/3447 |
| 2012/0047295 | A1 * | 2/2012 | Wong | G06F 13/102 710/50 |
| 2013/0212425 | A1 * | 8/2013 | Blaine | G06F 11/3648 714/6.1 |
| 2017/0132067 | A1 | 5/2017 | Singaravelu Vanaja et al. | |
| 2017/0277581 | A1 | 9/2017 | Lea et al. | |
| 2019/0004887 | A1 * | 1/2019 | Jeyasingh | G06F 11/0793 |

* cited by examiner

*Primary Examiner* — Yair Leibovich
(74) *Attorney, Agent, or Firm* — IP & T Group LLP

(57) ABSTRACT

Memory systems and method of operating the same enable debugging of a memory system with vendor unique (VU) commands without using a physical cable connection to a debugging port on the memory system. In one aspect, a Universal Asynchronous Receiver-Transmitter (UART) protocol is serialized over a VU host protocol. In another aspect, Joint Test Action Group (JTAG) may be performed over UART or serial advanced technology attachment (SATA).

12 Claims, 10 Drawing Sheets

REMOTE SSD DEBUG VIA HOST/SERIAL INTERFACE AND METHOD OF EXECUTING THE SAME

CROSS-REFERENCE TO RELATED APPLICATION

This application claims the benefit of U.S. Provisional Application No. 62/694,688, filed Jul. 6, 2018, the entire content of which is incorporated herein by reference.

BACKGROUND

1. Field

Embodiments of the present disclosure relate to configurations for remote debugging of solid state drives (SSDs) via a host/serial interface, and method of executing such scheme.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, SSDs, and similar products, for general storage and transfer of data.

SSDs typically include the following major components: dynamic random access memory (DRAM), system-on-chip (SOC), and NAND. To debug the SSD components, a special debug port is soldered on the printed circuit board (PCB) on which the SSD components are disposed for Universal Asynchronous Receiver-Transmitter (UART) or Joint Test Action Group (JTAG) testing or verification. In a UART shell environment, UART command execution is performed using a physical cable connection. Also, at present, using JTAG over UART or host-protocol to view the current internal state of an operational SSD, a physical connection with the SSD is needed. However, in some environments, such connection may not be possible or feasible.

In this context, embodiments of the present invention arise.

SUMMARY

An aspect of the present invention enables replacing a UART physical cable connection to the debug port of the SSD with VU (vendor unique) commands, which makes it possible to use the UART over host protocols, e.g., serial advanced technology attachment (SATA), non-volatile memory express (NVMe), and the like.

Another aspect of the present invention, enables replacing a JTAG physical cable connection to the debug port of the SSD with VU commands or UART.

Accordingly, an aspect of present invention includes a method for debugging a memory system including a memory device. The method comprises storing debugging logic in the memory device; transferring vendor unique (VU) commands from a host via a host protocol to the memory system without using a physical cable connection to a debug port on the memory system; and debugging at least one component in the memory system in response to VU commands.

Another aspect of the present invention is directed to a memory system that comprises multiple firmware cores; a UART serial hardware element in communication with each of the firmware cores; a memory device in which a UART log is stored, the UART log containing debugging information; a UART sniffer embodied in at least one of the firmware cores and configured to communicate with the UART log. VU commands are transferred from a host over a VU host protocol to the memory system for debugging of the memory system, without using a physical cable connection to a debug port on the memory system.

In another aspect of the present invention, a method for debugging a memory system including a memory device is provided. Such method comprises communicating between a host client and at least one server module in a firmware core of the memory device; communicating between a host converter and at least one server module in the firmware core; communicating between a memory device interface and a host interface; and debugging at least one component in the memory system in accordance with the communicating operations.

Additional aspects of the present invention will become apparent from the following description.

DETAILED DESCRIPTION

Figure 1:
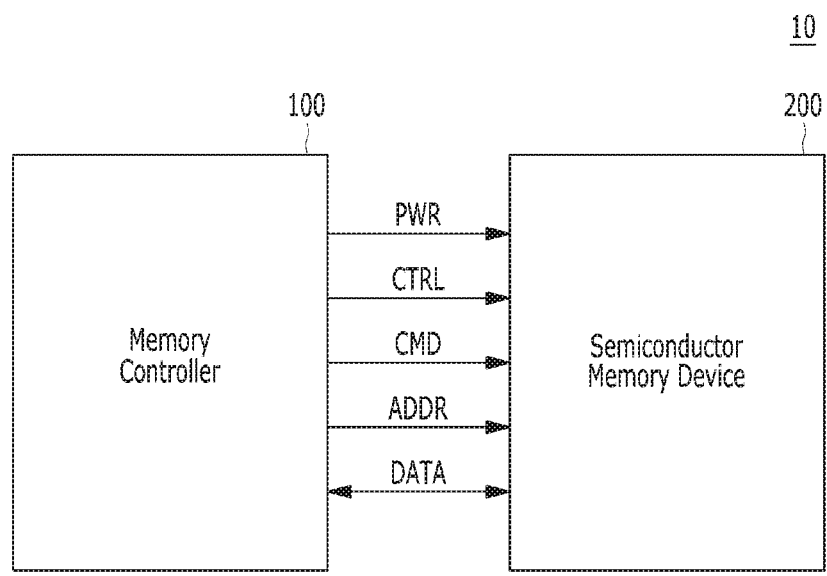
FIG. 1 is a diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 are preferably flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
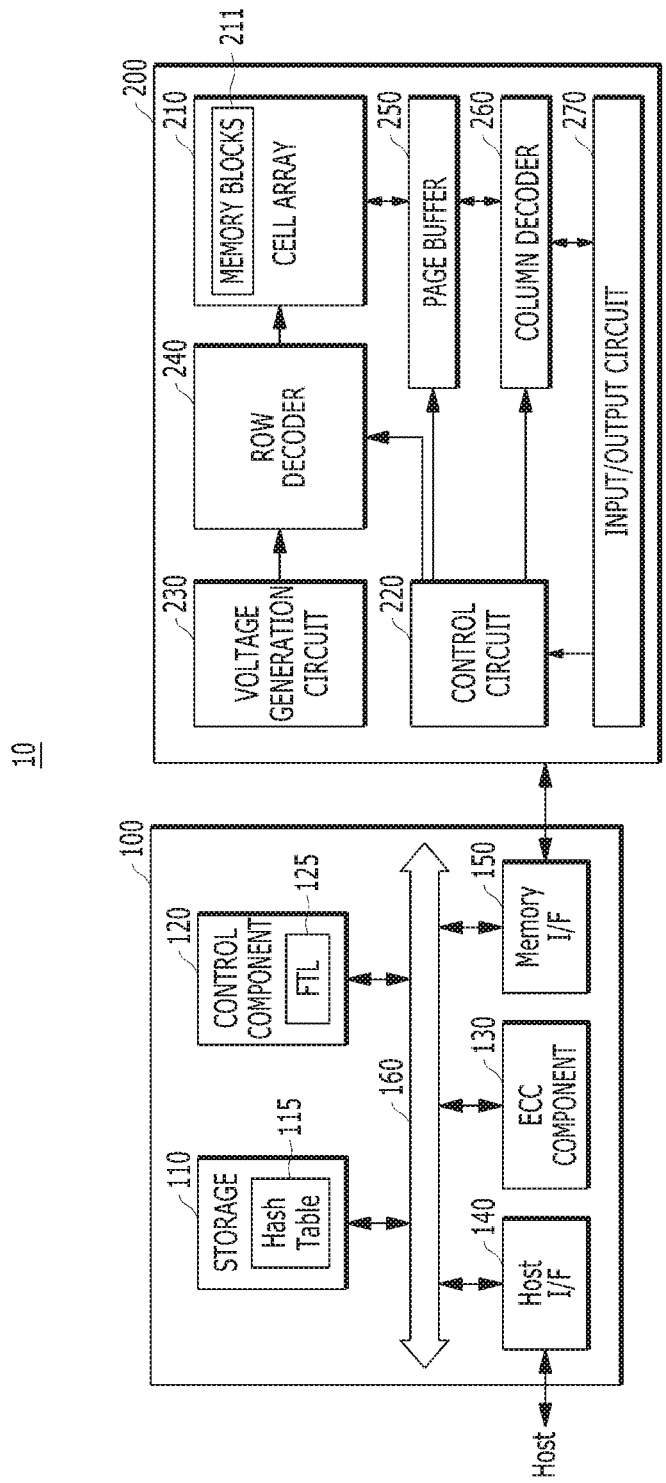
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like. The storage 110 may include a hash table 115.

The control component 120 may control general operations of the memory system 10, and a write operation or a read operation for the memory device 200, in response to a write request or a read request from the host device. The control component 120 may drive firmware, referred to as a flash translation layer (FTL) 125, to control general operations of the memory system 10. For example, the FTL 125 may perform operations such as logical-to-physical (L2P) mapping, wear leveling, garbage collection (GC), and/or bad block handling. The FTL 125 may be implemented, as firmware, in the controller 100, and more specifically, in the control component 120. The L2P mapping is known as logical block addressing.

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation, such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM). The ECC component 130 may include any and all circuits, systems or devices for suitable error correction operation.

The host interface 140 may communicate with the host device through one or more of various interface protocols, such as a universal serial bus (USB), a multi-media card (MMC), peripheral component interconnect express (PCI-e or PCIe), a small computer system interface (SCSI), a serial-attached SCSI (SAS), a serial advanced technology attachment (SATA), a parallel advanced technology attachment (PATA), non-volatile memory express (NVMe), an enhanced small disk interface (ESDI), and integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component (or CPU) 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer (array) 250, which may be in the form of an array of page buffers, a column decoder 260, and an input/output circuit 270. The memory cell array 210 may include a plurality of memory blocks 211 which may store data. Subsets of the memory blocks may be grouped into respective super blocks (SBs) for certain operations. SBs and their use in the context of embodiments of the present invention are described in more detail below.

The voltage generation circuit 230, the row decoder 240, the page buffer (array) 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
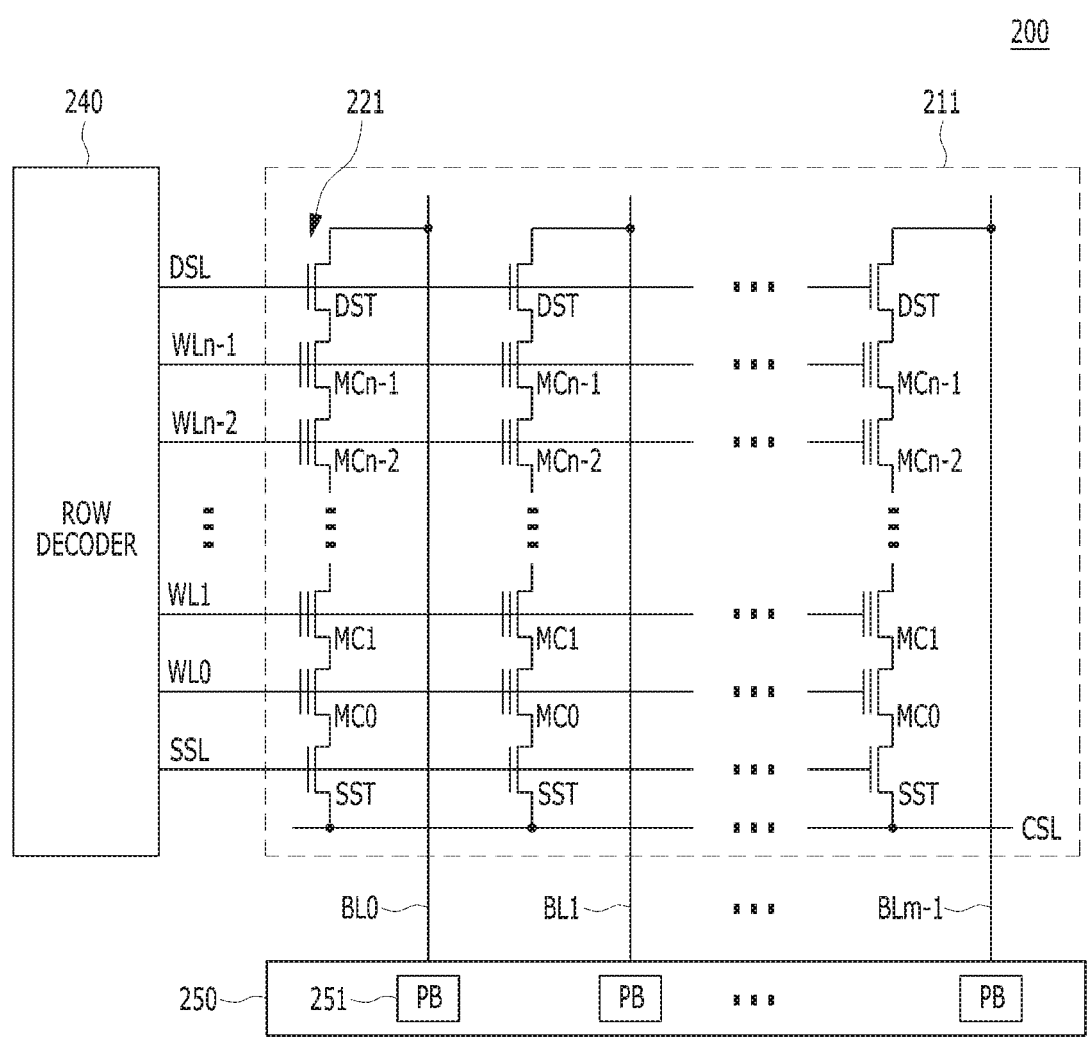
FIG. 3 is a circuit diagram illustrating a memory block of a memory device of a memory system in accordance with an embodiment of the present invention.

The page buffer (array) 250 may be in electrical communication with the memory cell array 210 through bit lines BL (shown in FIG. 3). The page buffer (array) 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer (array) 250 may be in the form of a page buffer array including a plurality of page buffers 251 that are coupled to the bit lines BL0 to BLm-1. The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
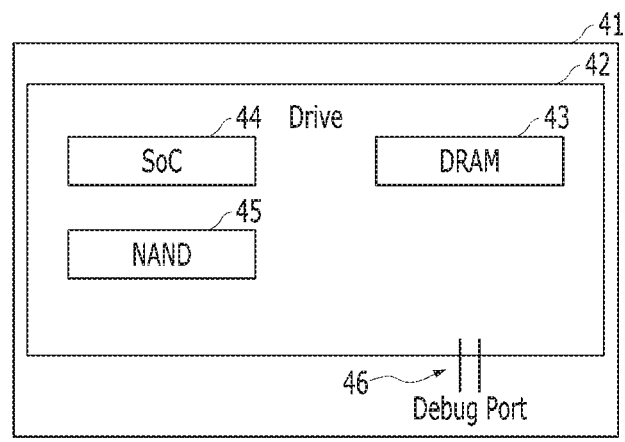
FIG. 4 is a schematic diagram illustrating a debug port on a PCB of an SSD.

As previously noted, the memory controller 100 and the semiconductor memory device 200 may be integrated in an SSD. Referring to FIG. 4, an exemplary SSD 42 may be disposed on a PCB 41. Main components of the SSD 42 include DRAM 43, SoC 44 and NAND 45. A debug port 46 may be soldered on the PCB 41. A cable may be attached to the debug port 46 to obtain access to components of the SSD 42 for viewing, testing, verifying, and the like data structures and variables. However, in some environments, such a physical connection is either not possible or not feasible.

Embodiments of the present invention provide techniques for remote debugging of an SSD via a host/serial interface. In an embodiment in the context of a UART shell, a UART physical cable connection to the debug port 46 is replaced with VU commands. In another embodiment in the context of JTAG over UART or host-protocol, a JTAG physical connection to the debug port 46 is replaced with VU commands or UART.

Figure 5:
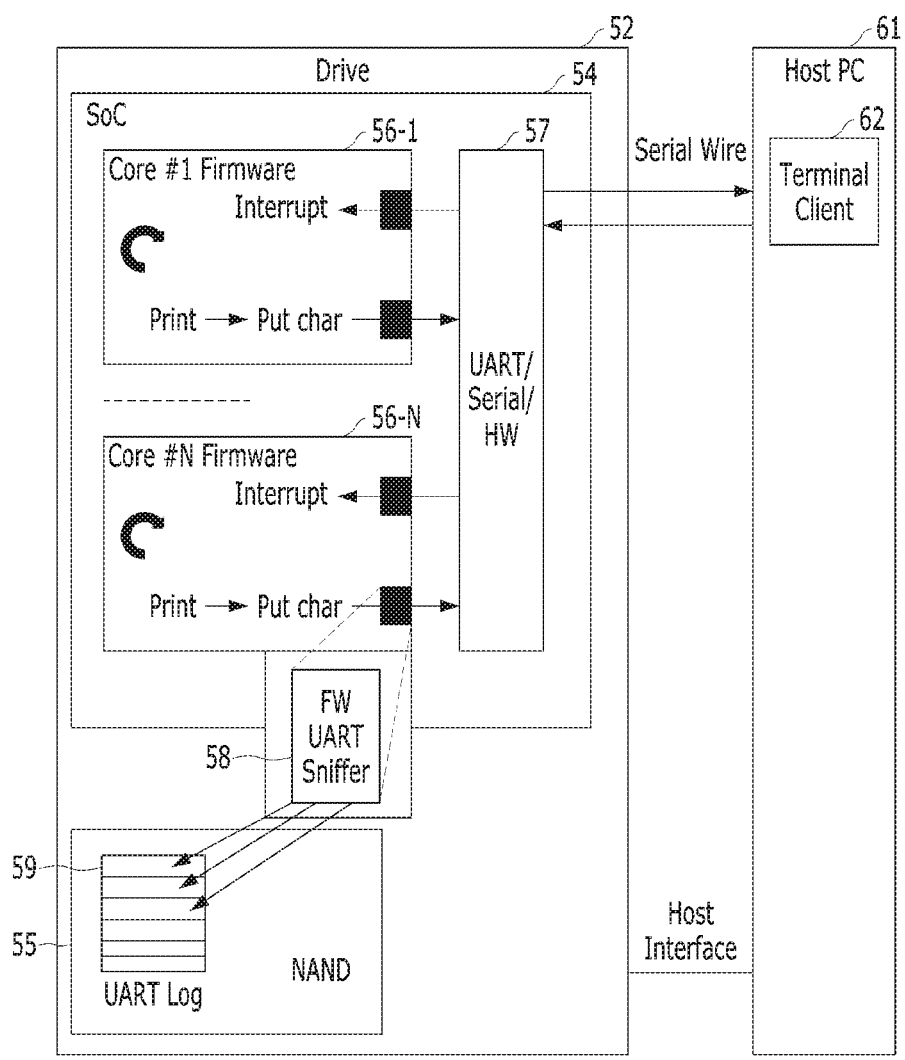
FIG. 5 is a schematic diagram illustrating storing a UART log in a memory device, e.g., NAND, in accordance with an embodiment of the present invention.

FIG. 5 is a schematic diagram illustrating storing a UART log in a NAND, e.g., memory device, in accordance with an embodiment of the present invention, which is in the context of the UART shell. As shown in FIG. 5, an SSD 52 includes an SoC 54 and a NAND 55. The SSD 52 may include other components as well, e.g., DRAM. Such other components are not shown to enable more clear presentation of features of the embodiment.

The SoC 54 may include N cores of firmware including core #1 firmware 56-1 to core #N firmware 56-N. Each firmware core 56-1, . . . , 56-N interfaces with a UART serial hardware element 57, which may also be disposed on the SoC 54. Each firmware core 56-1, . . . , 56-N may include a UART sniffer 58, which may be implemented in firmware. The UART sniffer 58 accesses a UART log 59 which is stored in the NAND 55.

A host 61, which may be a PC, includes a terminal client 62. The host 61 communicates with the SSD 52. Such communication may be over a serial connection and via a host interface. The host 61 may include debugging components for debugging components of the SSD 52.

With this arrangement, the UART protocol may be serialized over a VU host protocol between the host 61 and the UART serial hardware element 57. UART command execution may be done without an actual UART physical connection.

Figure 6:
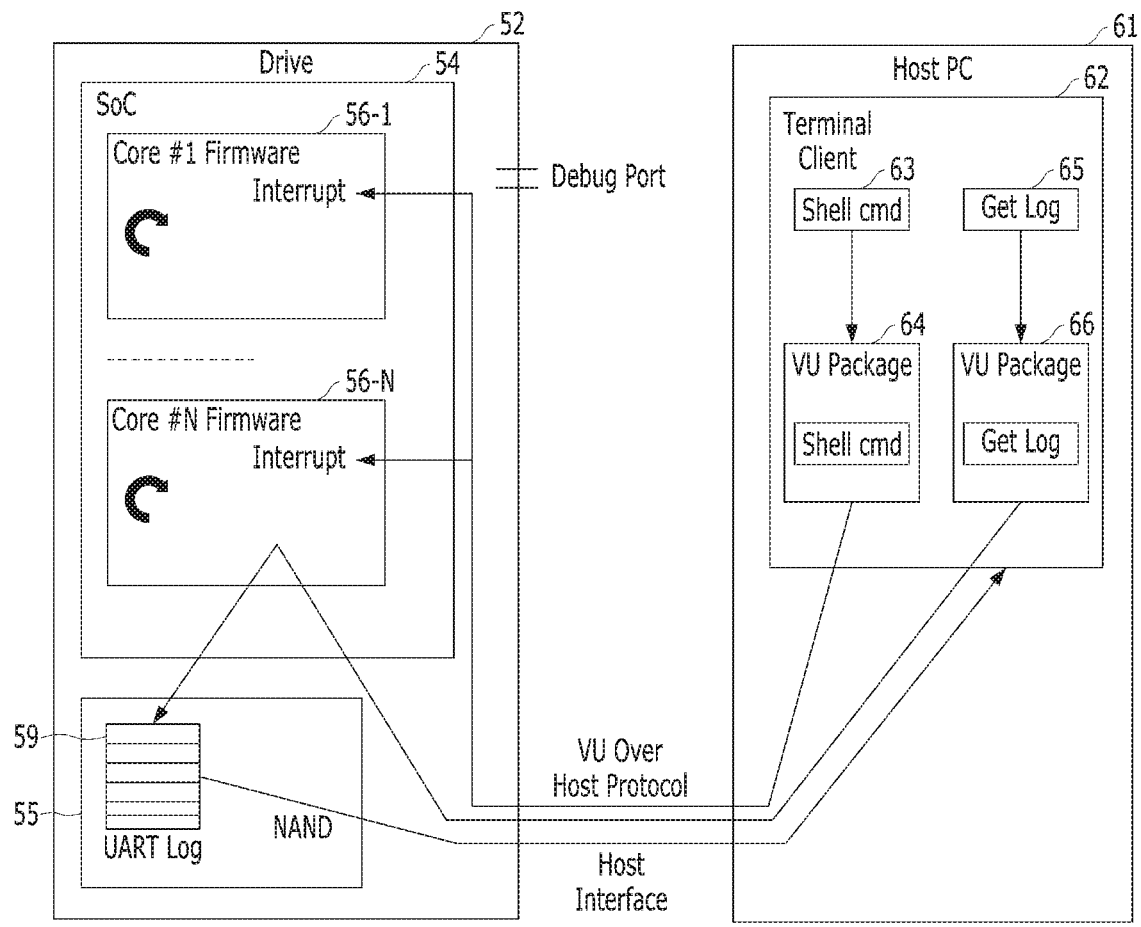
FIG. 6 is a schematic diagram illustrating UART protocol serialization over a vendor unique (VU) host protocol, in accordance with an embodiment of the present invention.

FIG. 6 shows UART protocol serialization over VU host protocol in accordance with an embodiment of the present invention. Components in FIG. 6 also shown in FIG. 5 are identified with the same reference numerals. As further shown in FIG. 6, within the terminal client 62, a shell command 63 is incorporated into a first VU package 64, and a get log 65 is incorporated into a second VU package 66. The first VU package 64 with the shell command 63 installed therein delivers VU commands to each firmware core 56-1, . . . , 56-N over host protocol. The second VU package 66 with the get log 65 installed is used to request debugging information from the UART log 59 in the NAND 55. The request and subsequent retrieval of the debugging information is done over the host interface. While the SSD 52 may include a debug port, as shown in FIG. 6, such port is not used for debugging in accordance with embodiments of the present invention.

Another aspect of the present invention enables performing JTAG testing over UART/SATA. Register/memory view, stepping, setting breakpoints, and run/stop are available with this arrangement.

Figure 7:
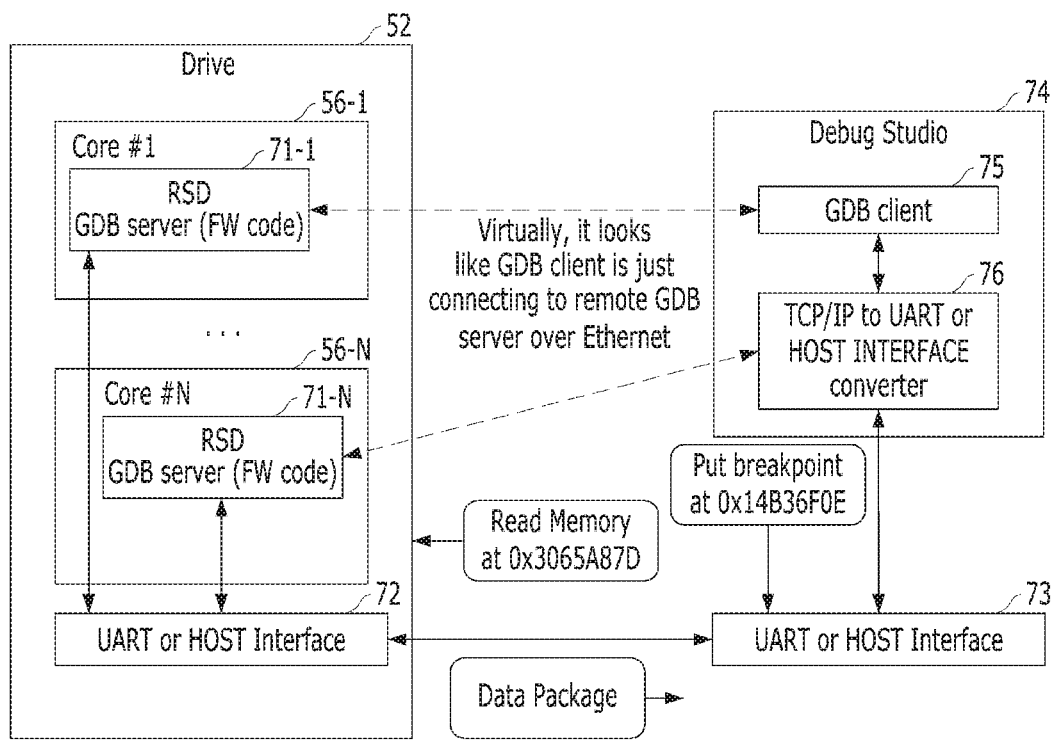
FIG. 7 is a schematic diagram illustrating a flow of a remote serial debug operation, in accordance with an embodiment of the present invention.

To that end, FIG. 7 shows a flow of a remote serial debug operation, in accordance with an embodiment of the present invention. Referring to FIG. 7, the SSD 52 is illustrated with its firmware cores: core #1 firmware 56-1 to core #N firmware 56-N, which include RSD GDB server modules 71-1 to 71-N respectively. Each such module includes a GDB server program, which may be in firmware (FW). The code of these RSD GDB server modules 71-1 to 71-N makes it possible to remotely debug other programs. Each of the modules 71-1 to 71-N is in communication with a UART or HOST interface 72, which in turn is in communication with a UART or HOST interface 73 on a host side.

The host side may include a debug studio 74, which is a suite of software development tools including a debugger. The debug studio 74, which may be implemented on a host PC or the like, may include a GBD client 75 and a TCP/IP to UART or HOST interface converter 76, the latter of which is in communication with the GBD client 75 and with the UART or HOST interface 73.

Figure 8:
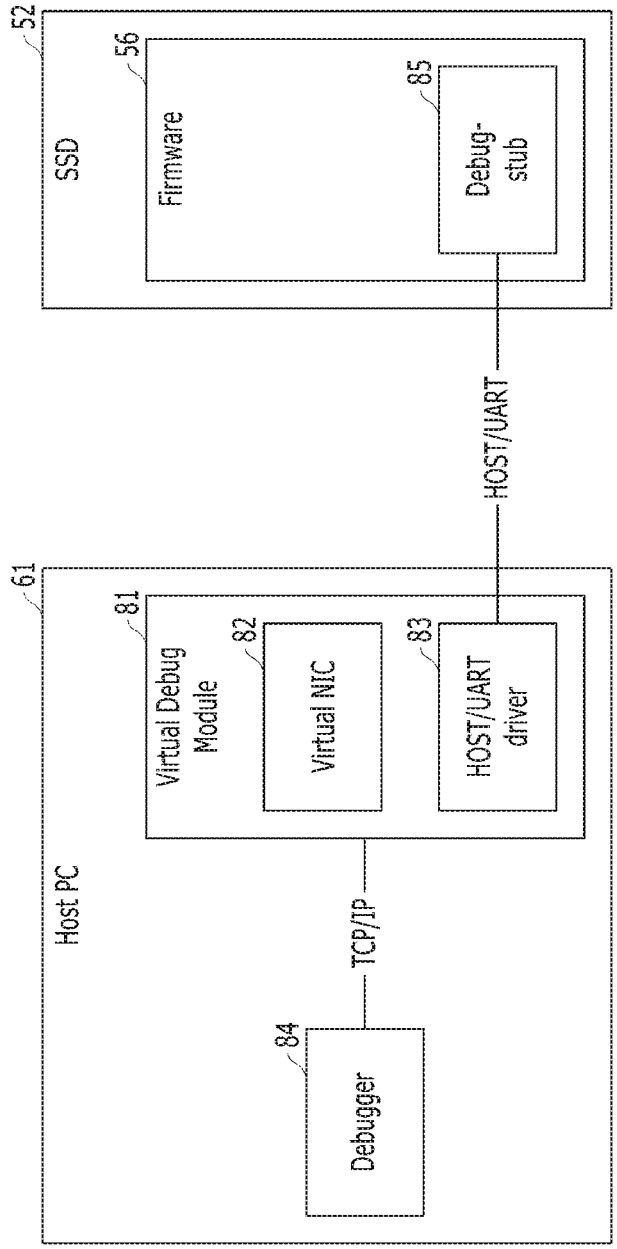
FIG. 8 is a schematic diagram illustrating a remote serial debug (RSD) implementation via a virtual debug module, in accordance with an embodiment of the present invention.

One use of the debugger of the debug studio 74 is shown in FIG. 8, which is an RSD implementation via a virtual debug module 81, in accordance with an embodiment of the present invention. The virtual debug module 81 may include a virtual network interface controller (NIC) 82 and a HOST/UART driver 83. A debugger 84 (of the debug studio 74) may communicate with the virtual debug module 81 via a TCP/IP link. The driver 83 of the virtual debug module 81 may communicate with a debug stub 85 embodied in the firmware 56 of the SSD 52. Here, firmware 56 may be a collective representation of the firmware cores 564 to 56-N shown in FIGS. 5-7 and the debug stub 85 may itself be a part or piece of the firmware. The debug stub 85 may be configured to realize debugger functions such as debug registers, setup or setting of breakpoints, and memory read.

Figure 9:
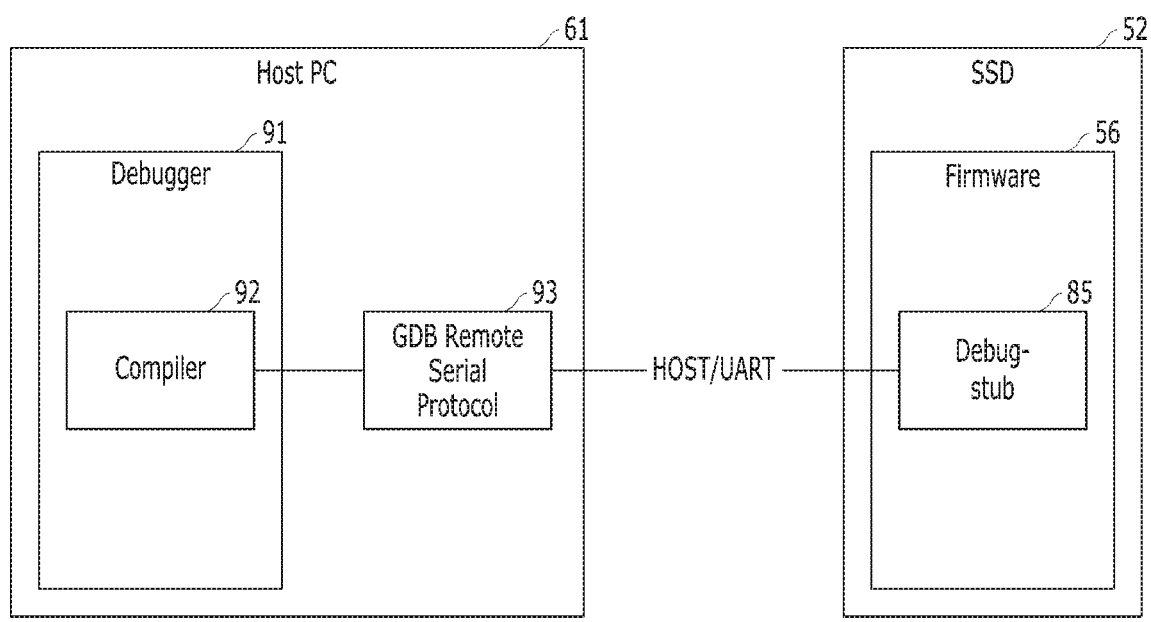
FIG. 9 is a schematic diagram illustrating RSD implementation via a GNU debugger (GDB) remote serial protocol, in accordance with an embodiment of the present invention.

Another use of the debugger of the debug studio 74 is shown in FIG. 9, which is an implementation of the debug stub 85 via a debugger 91. The debugger 91 may include a compiler 92, which is in communication with a GDB remote serial protocol component 93. Components 91, 92 and 93 may be embodied in host 61. The debugger 91 communicates with the SSD 52 and in particular the debug stub 85 therein, via the GDB remote serial protocol component 93, which communicates with the debug stub 85 via HOST/UART.

Figure 10:
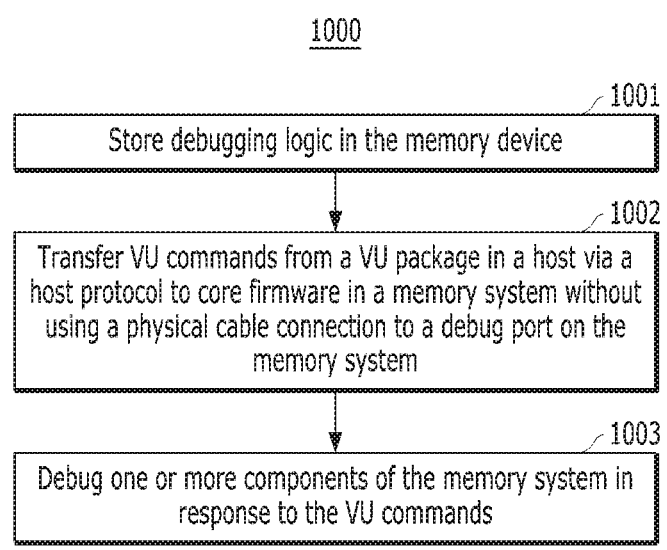
FIG. 10 is a flow chart illustrating processes of debugging a memory system without using a physical cable connection to a debug port on the memory system, in accordance with embodiments of the present invention.

FIG. 10 is a flow chart describing steps in processes of debugging a memory device or one or more components thereof, in accordance with embodiments of the present invention. The steps shown in flow chart 1000 are exemplary, Those skilled in the art will understand that additional and/or alternative steps may be performed, or that the order of steps may be changed, to effectuate aspects of the present invention without departing from the inventive concepts disclosed herein.

At step 1001, debugging logic may be stored in memory device 200, e.g., NAND 55. The debugging logic may comprise, or be embedded in, UART log 59. At step 1002, VU commands are transferred from host 61 via a host protocol to memory system 10, e.g., SSD 52, without using a physical cable connection to a debug port on the SSD 52. At step 1003, one or more components of the SSD 52 are debugged in response to the VU commands.

As the foregoing demonstrates, embodiments of the present invention provide techniques to embodiments of the present invention greatly assist in debugging devices where debugging would otherwise be difficult or impossible, e.g., situations in which there is no JTAG socket, the SSD case cannot be opened and/or there is limited space to attach a debug cable. Implementations of the present invention may also reduce debugging costs in certain circumstances. Various embodiments may be expanded to allow debugging an SSD by just having remote access to the host or even through an HTTP protocol without having full control over the overall system.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A method for debugging a memory system including a memory device, the method comprising:
   storing debugging logic in the memory device;
   transferring vendor unique (VU) commands from a host via a host protocol to the memory system without using a physical cable connection to a debug port on the memory system; and
   debugging at least one component in the memory system in response to VU commands
   wherein the debugging logic comprises a Universal Asynchronous Receiver-Transmitter (UART) log.

2. The method of claim 1, wherein the transferring comprises transferring the VU commands from a VU package residing in the host to core firmware in the memory system.

3. The method of claim 1, wherein the debugging comprises requesting debugging information from the debugging logic via core firmware.

4. The method of claim 3, wherein the debugging further comprises retrieving the debugging information directly from the debugging logic and transferring the retrieved debugging information to the host.

5. The method of claim 3, wherein the requesting of debugging information is performed from a VU package residing in the host.

6. The method of claim 1, wherein the memory system comprises a solid state drive (SSD) and the memory device comprises a NAND memory embodied in the SSD.

7. A memory system comprising:
   multiple firmware cores;
   a Universal Asynchronous Receiver-Transmitter (UART) serial hardware element in communication with each of the firmware cores;
   a memory device in which a UART log is stored, the UART log containing debugging information;
   a UART sniffer embodied in at least one of the firmware cores and configured to communicate with the UART log,
   wherein vendor unique (VU) commands are transferred from a host over a VU host protocol to the memory system for debugging of the memory system, without using a physical cable connection to a debug port on the memory system.

8. The memory system of claim 7, wherein a UART protocol is serialized over the VU host protocol.

9. A method for debugging a memory system including a memory device, the method comprising:
   communicating between a host client and at least one server module in a firmware core of the memory device;
   communicating between a host converter and at least one server module in the firmware core;
   communicating between a memory device interface and a host interface; and
   debugging at least one component in the memory system in accordance with the communicating operations, wherein the host converter comprises a TCP/IP to Universal Asynchronous Receiver-Transmitter (UART) converter.

10. The method of claim 9, wherein the debugging is performed using a host debugger, a host virtual debug module and a debug stub residing in the firmware core.

11. The method of claim 10, wherein the host virtual debug module includes a virtual network interface controller and a host or Universal Asynchronous Receiver-Transmitter (UART) driver.

12. The method of claim 9, wherein the debugging is performed using a host debugger, a host GDB remote serial protocol and a debug stub residing in the firmware core.

* * * * *